(12) United States Patent
Kim et al.

(10) Patent No.: US 7,948,743 B2
(45) Date of Patent: May 24, 2011

(54) BEZAL SUPPORT FOR FLAT PANEL DISPLAY DEVICE

(75) Inventors: Min-Cheol Kim, Suwon-si (KR); Gil-Jae Choi, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 41 days.

(21) Appl. No.: 12/318,697

(22) Filed: Jan. 6, 2009

(65) Prior Publication Data

US 2009/0201438 A1    Aug. 13, 2009

(30) Foreign Application Priority Data

Feb. 11, 2008   (KR) .................. 10-2008-0012340

(51) Int. Cl.
- *H05K 5/00* (2006.01)
- *G06F 1/16* (2006.01)
- *G02F 1/1335* (2006.01)
- *G02F 1/1333* (2006.01)

(52) U.S. Cl. .............. 361/679.21; 361/679.02; 248/917; 349/58; 349/64; 345/905

(58) Field of Classification Search .................. 361/671, 361/679.01–679.61, 667, 67, 9.58; 349/58, 349/64, 141, 122; 248/125.9, 920, 176.1; 313/49, 512; 345/173, 178, 169, 208, 76, 345/104

See application file for complete search history.

(56) References Cited

U.S. PATENT DOCUMENTS

| 6,532,152 | B1 * | 3/2003 | White et al. ............... 361/692 |
| 7,259,808 | B2 * | 8/2007 | Kim et al. ................. 349/58 |
| 2006/0073891 | A1 * | 4/2006 | Holt ........................ 463/30 |
| 2006/0139271 | A1 * | 6/2006 | Okuda ...................... 345/88 |

FOREIGN PATENT DOCUMENTS

| JP | 2007-219300 | 8/2007 |
| KR | 1020000062936 A | 10/2000 |
| KR | 1020030067128 A | 8/2003 |
| KR | 10-2005-0070555 | 7/2005 |
| KR | 10-2006-0017231 | 2/2006 |
| KR | 10-2007-0033507 | 3/2007 |
| KR | 1020080034537 | 4/2008 |

OTHER PUBLICATIONS

Transmitter letter and Korean Office Action issued by Korean Patent Office on Aug. 28, 2009 in the corresponding Korean Patent Application No. 10-2008-0012340.

Notice of Allowance from Korean Patent Office issued in Applicant's corresponding Korean Patent Application No. 10-2008-0012340 dated Feb. 2010, and the Request for Entry of the Accompanying Notice of Allowance attached herewith.

* cited by examiner

*Primary Examiner* — Jayprakash N Gandhi
*Assistant Examiner* — Jerry Wu
(74) *Attorney, Agent, or Firm* — Robert E. Bushnell, Esq.

(57) ABSTRACT

A flat panel display includes a bezel having a first substrate part and a second substrate part perpendicularly extending from one side of the first substrate part. A flexible printed circuit board is attached to the second substrate part by a conductive tape, and electrostatic discharge and damage caused by external mechanical interference can be prevented.

20 Claims, 4 Drawing Sheets

BEZAL SUPPORT FOR FLAT PANEL DISPLAY DEVICE

CLAIM OF PRIORITY

This application makes reference to, incorporates the same herein, and claims all benefits accruing under 35 U.S.C. §119 from an application for FLAT PANEL DISPLAY DEVICE earlier filed in the Korean Intellectual Property Office on the 11 Feb. 2008 and there duly assigned Serial No. 10-2008-0012340.

BACKGROUND OF THE INVENTION

1. Field of the Invention

The present invention relates to a flat panel display, and more particularly, the present invention relates to a flat panel display including a bezel supporting a flexible printed circuit board.

2. Description of the Related Art

Generally, flat panel displays, such as Liquid Crystal Displays (LCDs), Field Emission Displays (FEDs), and Organic Light Emitting Diode Displays (OLEDs) are accommodated in a bezel functioning as a frame to mechanically and electrically protect the displays.

A flexible printed circuit board connected to the flat panel display may be bent and attached to a back side of the bezel, or may be planar to be horizontal to the bezel and fixed thereto by a tape. However, when the flexible printed circuit board is bent, electronic components mounted on the flexible printed circuit board may be damaged due to external mechanical interference, and mechanical interference may occur between the bent part and an edge of the bezel.

On the other hand, when the flexible printed circuit board is planar, since there is no supporting structure under it, it is structurally unstable and thus difficult to ground with respect to static electricity.

SUMMARY OF THE INVENTION

The present invention provides a flat panel display including a bezel which horizontally extends and supports a flexible printed circuit board.

In an exemplary embodiment of the present invention, a flat panel display includes: a bezel including a first substrate part having a bent part on an edge thereof, and a second substrate part perpendicularly extending from one side of the first substrate part; a flat display panel arranged within the first substrate part of the bezel, and including a pad part and a pixel region; and a flexible printed circuit board connected to the pad part and supported by the second substrate part of the bezel.

In another exemplary embodiment of the present invention, a flat panel display includes: a bezel including a first substrate part having a bent part on an edge thereof, and a second substrate part perpendicularly extending from one side of the first substrate part; a flat display panel arranged within the first substrate part of the bezel, and including a pad part and a pixel region; and a flexible printed circuit board connected to the pad part and supported by the second substrate part of the bezel. The second substrate part has an aperture.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

Figure 1:
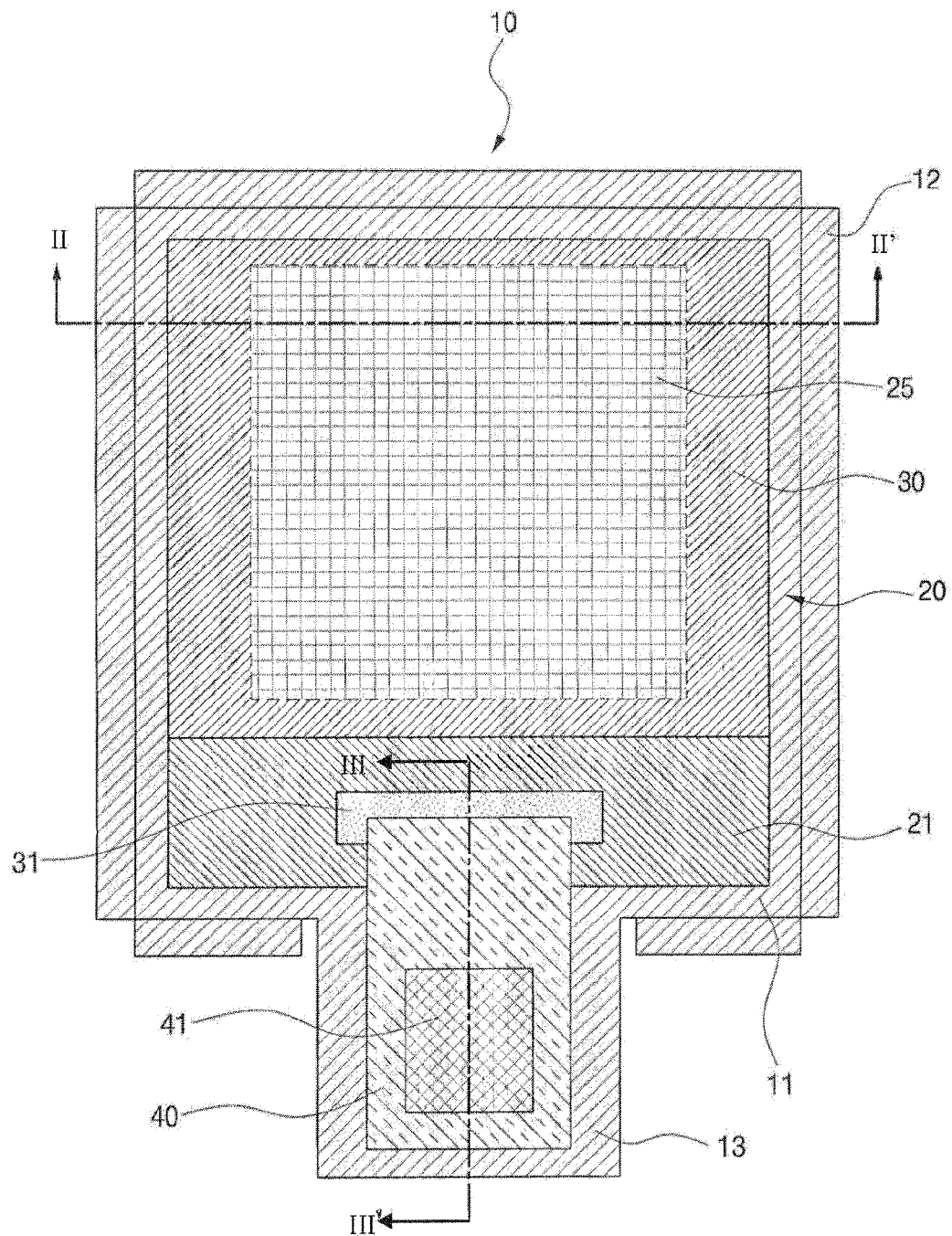
FIG. 1 is a plan view of a flat panel display according to a first exemplary embodiment of the present invention.

The present invention is described more fully hereinafter with reference to the accompanying drawings, in which exemplary embodiments of the present invention are shown.

In the drawings, lengths and thicknesses of layers and regions may be exaggerated for clarity. Furthermore, like numerals denote the like elements throughout the specification.

Figure 2:
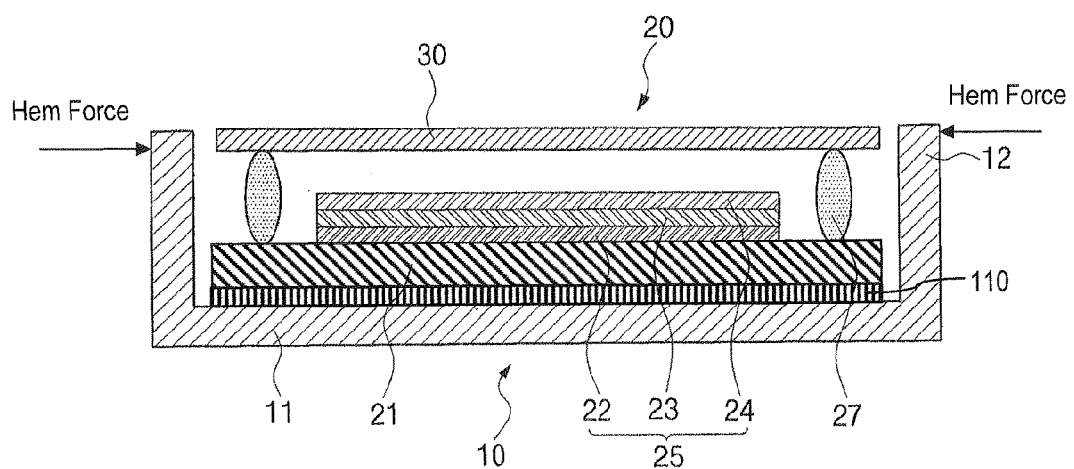
FIG. 2 is a cross-sectional view taken along line II-II' of FIG. 1.

FIG. 1 is a plan view of a flat panel display according to a first exemplary embodiment of the present invention, and FIG. 2 is a cross-sectional view taken along line II-II' of FIG. 1.

Referring to FIGS. 1 and 2, the flat panel display includes a bezel 10, a flat display panel 20 and a Flexible Printed Circuit Board (FPCB) 40.

The bezel 10 includes a first substrate part 11 supporting the flat display panel 20, and a second substrate part 13 horizontally extending from one side of the first substrate part 11.

The first substrate part 11 is bent at both edges in the same direction, thereby forming bent parts 12. Thus, the first substrate part 11 and the bent parts 12 may be formed of the same material.

The first substrate part 11 serves as a frame supporting and fixing the flat display panel 20. The first substrate part 11 is generally formed of a conductive metallic material, and connected to the flat display panel 20 and a ground terminal of the FPCB 40, such that electrical reliability is improved.

The bent parts 12 are formed by bending the both edges of the first substrate part 11 in the same direction, that is, they are bent in a vertical direction in the first exemplary embodiment of the present invention.

Thus, the flat display panel 20 is accommodated in the first substrate part 11 having the bent parts 12, so that the flat display panel 20 is protected from external impact.

The bent parts 12 may further be hemmed by hem force, that is, folded over (not illustrated), which is formed by folding the bent parts 12, for mechanical strength. Preferably, a hemmed structure, that is, a folded over structure, in which the bent parts 12 are folded at the edge of the bezel may be formed.

The second substrate part 13 is horizontally extended from a side of the first substrate part 11. The FPCB 40 is then supported.

To further protect the side surfaces of the flat display panel 20, the second substrate part 13 may be formed smaller, and the bent parts 12 may be formed in regions other than the second 11 substrate part 13 as illustrated in FIG. 1.

The flat display-panel 20 includes: a device substrate 21 on which a pixel region 25 having a plurality of pixels is formed, an encapsulation substrate 30 affixed to the device substrate 21, and a pad 31 providing an electrical signal to drive the pixel.

The device substrate 21 may be formed of an insulating material, such as a glass substrate or a plastic substrate.

On the device substrate 21, a pixel is formed of an organic light emitting diode including a first electrode 22 having a reflective layer (not illustrated) formed thereunder, an organic light emitting layer 23 formed on the first electrode 22, and a second electrode 24 formed on the organic light emitting layer 23.

While one organic light emitting diode is illustrated for convenience of the description in FIG. 2, a plurality of pixels are formed in the pixel region 25 in practice.

A Hole Injection Layer (HIL) and a Hole Transport Layer (HTL) may be formed between the organic light emitting layer 23 and the first electrode 22, and an Electron Transport Layer (ETL) and an Electron Injection Layer (EIL) may be formed between the organic light emitting layer 23 and the second electrode 24.

The encapsulation substrate 30 may be formed of the same material as the device substrate 21, and edges of the device substrate 21 are affixed to the encapsulation substrate 30 by a sealant 27 to protect the pixel region 25 formed therein from external air.

A UV hardening agent or a thermal hardening agent, such as epoxy, may be used as the sealant 27.

The organic light emitting diode may be an active-matrix organic light emitting diode, which further includes a thin film transistor including a semiconductor layer formed between the device substrate 21 and the first electrode 22, a gate electrode corresponding to the semiconductor layer, and source and drain electrodes electrically connected to the semiconductor layer.

The flat display panel 20 is attached and fixed onto the first substrate part 11 of the bezel 10 by a cushion tape 110 having an adhesive on both surfaces thereof. The cushion tape 110 may be formed of an open celled microcellular polyurethane material.

The FPCB 40 is connected to the pad part 31 of the flat display panel 20, and the pad part 31 serves to provide an electrical signal to a data driver (not illustrated) and a scan driver (not illustrated) to drive the plurality of pixels in the pixel region 25 of the flat display panel 20.

The FPCB 40 is disposed on the second substrate part 13 of the bezel 10, and a conductive tape is attached to the second substrate part 13 such that the FPCB 40 is fixed and electrically grounded to the bezel to improve electrostatic discharge (ESD) of the FPCB 40.

Figure 3:
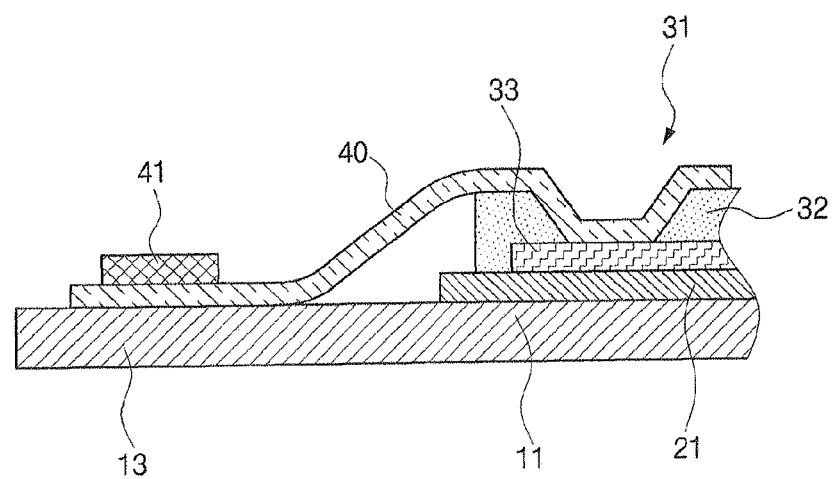
FIG. 3 is a cross-sectional view taken along line III-III' of FIG. 1.

FIG. 3 is a cross-sectional view taken along line III-III' of FIG. 1.

Referring to FIG. 3, the bezel 10 includes the first substrate part 11 and the second substrate part 13 horizontally extending from a side of the first substrate part 11.

The device substrate 21 is formed on the first substrate part 11, and a metal interconnection 33, connected to a pixel region 25 and transmitting a signal, is formed in a pad part 31 on the device substrate 21.

A passivation layer 32 is formed on the metal interconnection 33 in the pad part 31, and the metal interconnection 33 is connected to the FPCB 40 through a via hole in the passivation layer 32.

The FPCB 40, connected to the metal interconnection 33, is attached to the second substrate part 13 by an adhesive tape (not illustrated) at the opposite side of a surface on which an electronic component 41 is mounted.

Preferably, the adhesive tape may be a conductive tape, and thus, the FPCB 40 may be electrically connected to the bezel 10. Thus, the ESD and grounding problems caused in the FPCB 40 may be solved by the bezel 10.

Figure 4:
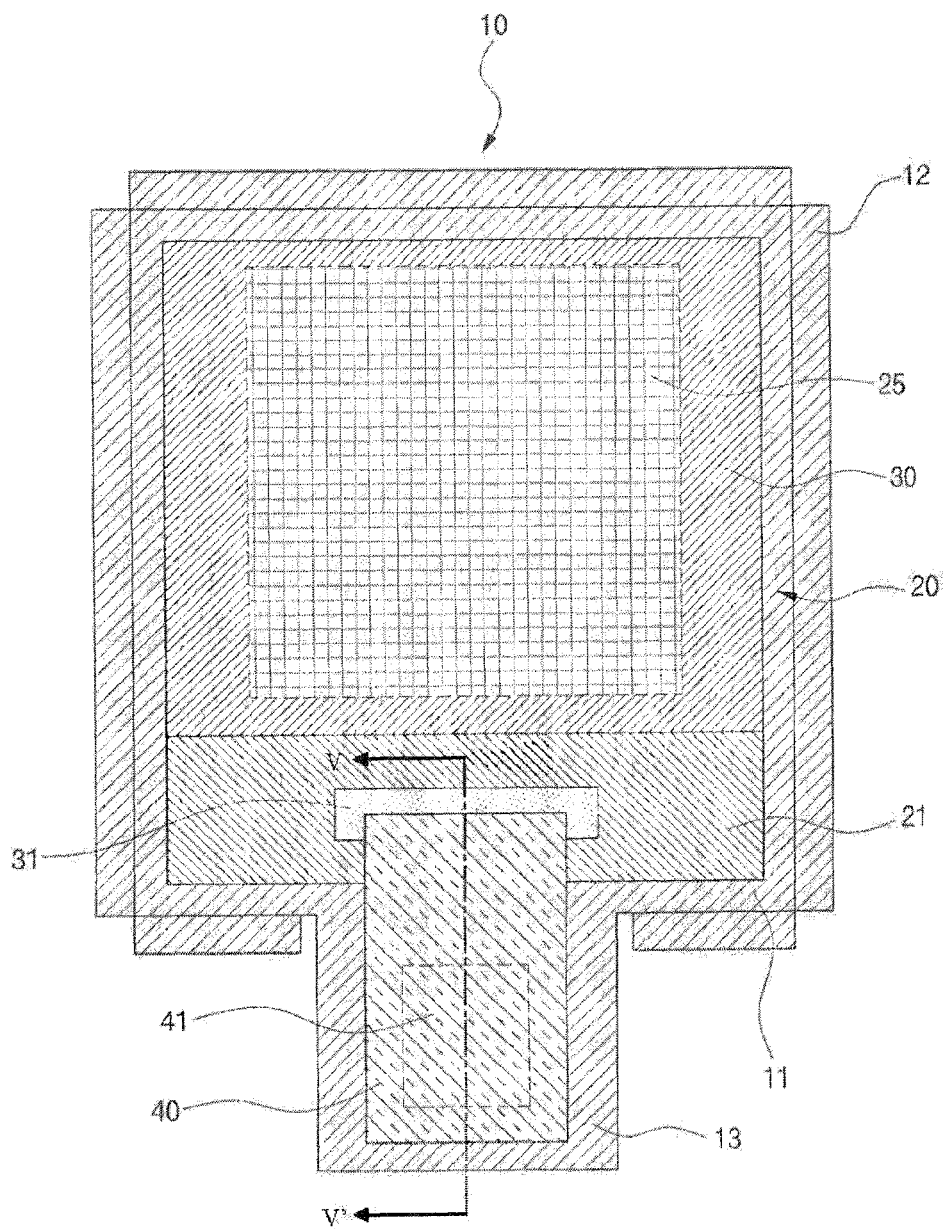
FIG. 4 is a plan view of a flat panel display according to a second exemplary embodiment of the present invention.
Figure 5:
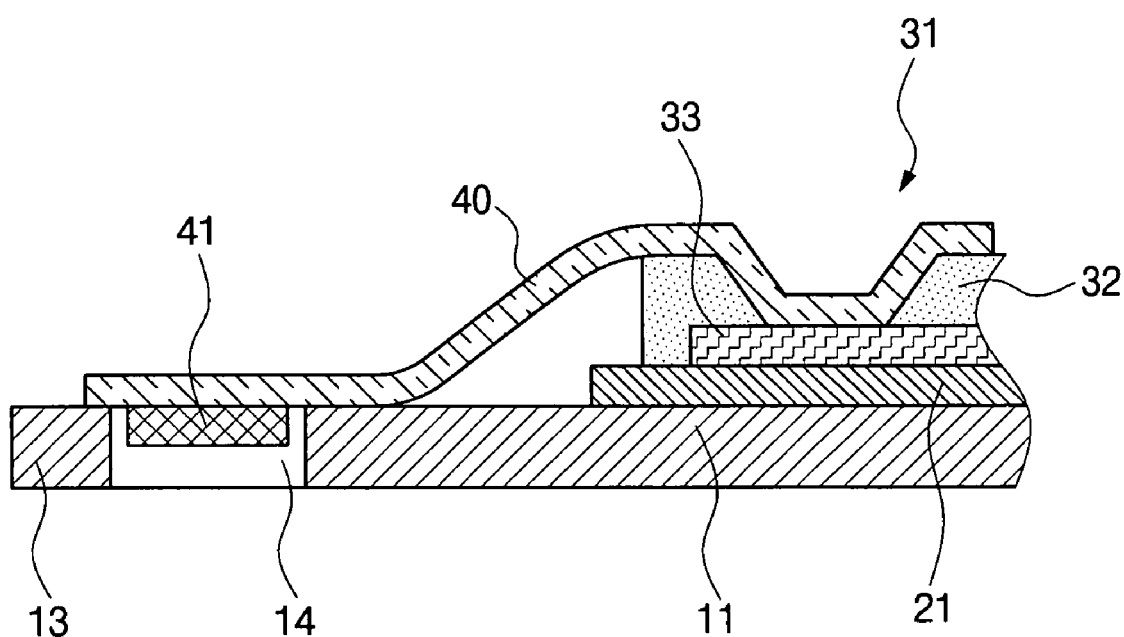
FIG. 5 is a cross-sectional view taken along line V-V' of FIG. 1.

FIG. 4 is a plan view of a flat panel display according to a second exemplary embodiment of the present invention, and FIG. 5 is a cross-sectional view taken along line V-V' of FIG. 4.

Referring to FIGS. 4 and 5, an organic light emitting display includes the bezel 10, the flat display panel 20 and the FPCB 40.

In the second exemplary embodiment of the present invention, the configuration, except for the bezel of the flat panel display, is the same as the first exemplary embodiment, and thus a detailed description thereof has been omitted.

The bezel 10 includes the first substrate part 11 and the second substrate part 13 horizontally extending from a side of the first substrate part 11.

The device substrate 21 is formed on the first substrate part 11, and the metal interconnection 33, connected to the pixel region 25 and transmitting a signal, is formed in the pad part 31 on the device substrate 21.

The passivation layer 32 is formed on the metal interconnection 33 in the pad part 31, and the metal interconnection 33 is connected to the FPCB 40 through a via hole in the passivation layer 32.

The FPCB 40, connected to the passivation layer 32, is supported by the second substrate part 13 in which an aperture 14 is formed.

Thus, the electronic component 41 mounted on the FPCB 40 is inserted into the opening 14, and thus protected from external mechanical interference.

The FPCB 40 may be attached to an edge of the opening by an adhesive tape (not illustrated), which is preferably a conductive tape, to be electrically connected to the bezel 10. Thus, the bezel 10 can solve ESD and grounding problems occurring in the FPCB 40.

While the organic light emitting diode among the flat panel displays is described in the exemplary embodiment of the present invention, the bezel structure may be applied to all kinds of flat panel displays, such as Liquid Crystal Displays (LCDs) and Field Emission Displays (FEDs).

Consequently, a flat panel display of the present invention can improve durability of a flexible printed circuit board, and reduce ESD.

Although the present invention has been described with reference to specific exemplary embodiments thereof, it will be understood by those skilled in the art that a variety of modifications and variations may be made to the present invention without departing from the spirit or scope of the present invention as defined by the appended claims.

What is claimed is:

1. A flat panel display device, comprising:
   a bezel including a first substrate part having a bent part at an edge of the first substrate part, and a second substrate part extending from one side of the first substrate part and beyond the bent part of the first substrate part;
   a flat display panel arranged within the first substrate part of the bezel, and the flat display panel including a pad part and a pixel region; and
   a flexible printed circuit board connected to the pad part and electrically connected to the second substrate part of the bezel, with an entirety of one major surface of the flexible printed circuit board facing toward the bezel.

2. The flat panel display device according to claim 1, wherein the second substrate part horizontally extends from the first substrate part.

3. The flat panel display device according to claim 1, wherein the second substrate part is of the same material as the first substrate part.

4. The flat panel display device according to claim 1, further comprising a conductive tape to attach the flexible printed circuit board to the second substrate part.

5. The flat panel display device according to claim 1, wherein the bent part is hemmed.

6. The flat panel display device according to claim 1, further comprising a cushion tape, having an adhesive on both surfaces thereof, to attach the flat display panel to the first substrate part of the bezel.

7. The flat panel display device according to claim 6, wherein the cushion tape comprises an open celled microcellular polyurethane material.

8. The flat panel display device according to claim 1, wherein the bezel comprises an electrically conductive metallic material.

9. A flat panel display device, comprising:
a bezel including a first substrate part having a bent part at an edge of the first substrate part, and a second substrate part extending from one side of the first substrate part and beyond the bent part of the first substrate part;
a flat display panel arranged within the first substrate part of the bezel, and including a pad part and a pixel region; and
a flexible printed circuit board connected to the pad part and electrically connected to the second substrate part of the bezel;
wherein the second substrate part has an aperture therein.

10. The flat panel display device according to claim 9, wherein an electronic component is arranged within the aperture.

11. The flat panel display device according to claim 9, wherein the second substrate part horizontally extends from the first substrate part.

12. The flat panel display device according to claim 9, wherein the second substrate part is of the same material as the first substrate part.

13. The flat panel display device according to claim 9, further comprising a conductive tape to attach the flexible printed circuit board to an edge of the aperture in the second substrate part.

14. The flat panel display device according to claim 9, wherein the bent part is hemmed.

15. The flat panel display device according to claim 9, further comprising a cushion tape, having an adhesive on both surfaces thereof, to attach the flat display panel to the first substrate part of the bezel.

16. The flat panel display device according to claim 15, wherein the cushion tape comprises an open celled microcellular polyurethane material.

17. The flat panel display device according to claim 9, wherein the bezel comprises an electrically conductive metallic material.

18. The flat panel display device according to claim 1, wherein:
the second substrate part is made of the same material as the first substrate part; and
the second substrate part has an aperture therein.

19. A flat panel display device, comprising:
a bezel including a first substrate part having a bent part at an edge of the first substrate part, and a second substrate part extending from one side of the first substrate part;
a flat display panel arranged wholly within the first substrate part of the bezel, and the flat display panel including a pad part and a pixel region; and
a flexible printed circuit board connected to the pad part and electrically connected to the second substrate part of the bezel, with a geometrical projection of a major surface of the flexible printed circuit board forming a flat continuum against the bezel.

20. The flat panel display device according to claim 19, wherein the second substrate part has an aperture accessed by the flexible printed circuit board.

* * * * *